United States Patent
Pines et al.

(10) Patent No.: US 12,017,919 B2
(45) Date of Patent: Jun. 25, 2024

(54) ORIENTATION INDEPENDENT, ROOM TEMPERATURE, HYPERPOLARIZATION OF DIAMOND NANO- AND MICRO-PARTICLES

(71) Applicants: THE REGENTS OF THE UNIVERSITY OF CALIFORNIA, Oakland, CA (US); RESEARCH FOUNDATION OF THE CITY UNIVERSITY OF NEW YORK, New York, NY (US)

(72) Inventors: Alexander Pines, Berkeley, CA (US); Ashok Ajoy, Fremont, CA (US); Raffi Nazaryan, Tujunga, CA (US); Xudong Lv, El Sobrante, CA (US); Carlos Meriles, New York, NY (US)

(73) Assignee: The Regents of the University of California, Oakland, CA (US)

( * ) Notice: Subject to any disclaimer, the term of this patent is extended or adjusted under 35 U.S.C. 154(b) by 674 days.

(21) Appl. No.: 16/760,834

(22) PCT Filed: Nov. 1, 2018

(86) PCT No.: PCT/US2018/058736
§ 371 (c)(1),
(2) Date: Apr. 30, 2020

(87) PCT Pub. No.: WO2019/089948
PCT Pub. Date: May 9, 2019

(65) Prior Publication Data
US 2021/0221691 A1    Jul. 22, 2021

Related U.S. Application Data

(60) Provisional application No. 62/581,238, filed on Nov. 3, 2017.

(51) Int. Cl.
C01B 32/28        (2017.01)
B01J 19/12        (2006.01)
G01R 33/28        (2006.01)

(52) U.S. Cl.
CPC .............. *C01B 32/28* (2017.08); *B01J 19/121* (2013.01); *B01J 19/126* (2013.01);
(Continued)

(58) Field of Classification Search
CPC ....... C01B 32/28; B01J 19/121; B01J 19/126; B01J 2219/0879; B01J 2219/089;
(Continued)

(56) References Cited

U.S. PATENT DOCUMENTS 8,085,097 B2 *  12/2011  Cloutier ................ H03L 7/197
                                                                         331/23
2016/0054402 A1   2/2016  Meriles
2018/0180689 A1   6/2018  Parker et al.

FOREIGN PATENT DOCUMENTS

WO        2016188557 A1    12/2016
WO    WO-2016188557 A1 *   12/2016 ............ G01N 24/12
WO        2018001756 A1     1/2018

OTHER PUBLICATIONS

Fischer et al (Bulk Nuclear Polarization Enhanced at Room Temperature by Optical Pumping, Physical Review Letters, 2013) (Year: 2013).*

(Continued)

*Primary Examiner* — Colin W. Slifka
*Assistant Examiner* — Logan Edward Laclair
(74) *Attorney, Agent, or Firm* — Miller Nash LLP

(57) ABSTRACT

A method of hyperpolarizing diamond particles includes applying a laser to a sample of the diamond particles, irradiating the diamond particles with a sweeping microwave to cause diamond polarization, shuttling the diamond (Continued)

particles through a magnetic field to detect $^{13}C$ nuclei in the diamond particles, and relaying the diamond polarization to nuclear spins to one of a surrounding solid or fluid.

12 Claims, 6 Drawing Sheets

(52) U.S. Cl.
CPC ..... *G01R 33/282* (2013.01); *B01J 2219/0879* (2013.01); *B01J 2219/089* (2013.01); *B01J 2219/1206* (2013.01)

(58) Field of Classification Search
CPC ........... B01J 2219/1206; G01R 33/282; G01R 33/62; G01N 24/12; G01N 24/08
See application file for complete search history.

(56) References Cited

OTHER PUBLICATIONS

Bumb et al., "Silica Encapsulation of Fluorescent Nanodiamonds for Colloidal Stability and Facile Surface Functionalization," J. Amer. Chem. Soc., 135:7815-7818, 2013.

Chang et al., "Mass Production and Dynamic Imaging of Fluorescent Nanodiamonds," Letters, 3:284-288, Apr. 27, 2008.
Fu et al., "Characterization and application of single fluorescent nanodiamonds as cellular biomarkers," PNAS 104:3, pp. 727-732 Jan. 16, 20078.
Liu et al. "Biocompatible and detectible carboxylated nanodiamond on human cell," Nanotechnology 18 (2007), 11 pages.
Montalti et al., Nanodiamonds and silicon quantum dots: ultrastable and biocompatible luminescent nanoprobes for long-term bioimaging, Chem. Soc. Rev., 44:4853-4921, Dec. 15, 2015.
Parker et al., "Optically-pumped dynamic nuclear hyperpolarization in 13C enriched diamond," Dept. Chem, University of California, Berkeley, Aug. 3, 2017, 12 pages.
Wu et al., "Diamond Quantum Devices in Biology," Angew. Chem. Int. Ed., 55:6586-6598, 2016.
Yu et al., "Bright Fluorescent Nanodiamonds: No. Photobleaching and Low Cytotoxicity," J. Am. Chem. Soc. 127:17604-17605, Nov. 25, 2005.
International Search Report and Written Opinion, PCT/US2018/58736, dated Jan. 28, 2019, 14 pages.
Ajoy et al., "Enhanced Dynamic Nuclear Polarization via Swept Microwave Frequency Combs," Proceedings of the National Academy of Science, 115:10576-10581, Jul. 19, 2018.

* cited by examiner

ORIENTATION INDEPENDENT, ROOM TEMPERATURE, HYPERPOLARIZATION OF DIAMOND NANO- AND MICRO-PARTICLES

CROSS REFERENCE TO RELATED APPLICATIONS

This application is a 371 of International Application No. PCT/US2018/058736 filed Nov. 1, 2028, claims priority to and the benefit of U.S. Provisional Patent Application No. 62/581,238 filed Nov. 3, 2017, which is incorporated herein by reference in its entirety.

BACKGROUND

Nuclear Magnetic Resonance (NMR) is a widely impactful spectroscopic technique, and a true workhorse in a variety of fields ranging from chemical structure analysis to medical imaging. NMR relies upon detection of nuclear spins and their returns in a material under the influence of a magnetic field. Despite its incredible versatility and everyday utility, its inherently low sensitivity has prevented a deeper penetration of the technology, for instance in desktop spectrometers and in point-of-care settings. Dynamic nuclear polarization (DNP)—the ability to employ electron spins to enhance the polarization of, and hence signal from, nuclear spins—has emerged as an attractive solution for several applications. However, DNP involves extremely low temperatures on the order of 1 K, and magnetic fields in the range of 3 Tesla (3 T). This need to perform the electronic polarization at cryogenic temperatures and high magnetic fields has motivated the search for simpler, low-cost yet generally applicable hyperpolarization alternatives.

A particularly compelling idea, which has garnered much recent attention, is the use of atom-like defects in diamond as optical hyperpolarizing agents. Specifically, the electronic spin corresponding to the diamond Nitrogen Vacancy (NV) center is optically polarizable to ≈99% at room temperature, possesses remarkable coherence properties, and can be created close (<4 nm) to the surface to be hyperfine coupled to external nuclei. These attributes promise that polarization could be coherently transferred from the NV centers to nuclei in their neighborhood, boosting their NMR signal by orders of magnitude at room temperature. Indeed, large (>0.5%) optical hyperpolarization of $^{13}C$ nuclear spins in single crystal diamond was demonstrated recently by a variety of DNP techniques.

Despite this encouraging progress however, these methods were only limited to single crystals and with their very limited surface area of contact to the external liquid, DNP transfer has remained unsuccessful. A more viable alternative is the use of diamond in powdered form, either as crystals, nano- or micro-scale particles, which offers incredibly larger contact surface area, for instance ≥6700 mm$^2$/mg for 100 nm particles, orders of magnitude greater than ~0.57 mm$^2$/mg for a single crystal of equivalent mass. Indeed the goal of optically "hyperpolarized nanodiamonds" has been a long-standing one [1, 2]; yet the challenge thrown up by the strong orientational dependence of the spin-1 NV centers have so far proven insurmountable. Unlike a single crystal with a narrow resonance, the electronic linewidth is greatly (inhomogenously) broadened to a ≈5.6 GHz powder pattern even at modest fields >0.1 T making conventional DNP strategies ineffective. The electronic linewidth is a measure of the width of the band of frequencies of radiation emitted or absorbed in an atomic or molecular transition.

DETAILED DESCRIPTION OF THE EMBODIMENTS

The embodiments here overcome these challenges to obtain the first optically hyperpolarized diamond powder, obtaining high bulk $^{13}C$ polarization comparable to the best results in single crystals. A new, remarkably simple, low-field optical DNP technique has been developed that proves to be fully orientation independent. Unlike conventional DNP, the regime performed the transfer at is rather unique—in effect, the NV (nitrogen vacancy) electrons can be polarized independent of field, and low-field exploited to circumvent the broadening of the electronic linewidth.

Some of the terms used here have particular meanings. For example, 'low field' as used here refers to magnetic fields with a field strength of 0-1 Tesla (T). The polarization field will be referred to as $B_{pol}$. The term "diamond particles" means single crystal diamonds, diamond microparticles and diamond nano-particles.

Figure 1:
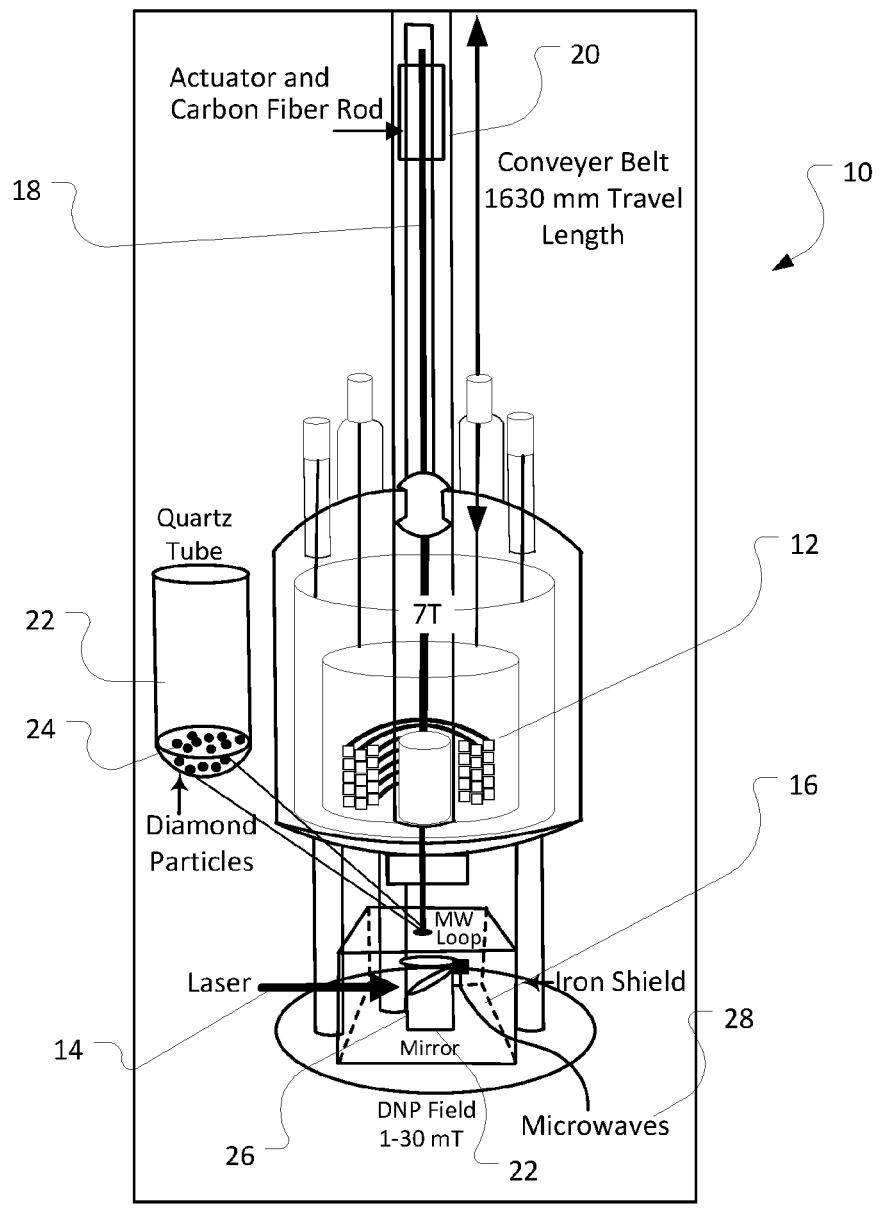
FIG. 1 shows an embodiment of an apparatus for sample shuttling, optically pumping with laser and polarization transfer by microwave irradiation.

In contrast to previous work on single NV centers or small ensembles, here the bulk nuclear polarization is unambiguously detected by inductive readout subsequent to rapidly shuttling the hyperpolarized powder to high field shown in FIG. 1), and is compared against the corresponding Boltzmann polarization at 7 T. The DNP protocol is detailed in FIGS. 1-4.

In FIG. 1, the apparatus 10 includes a mechanical shuttle constructed over a 7 Tesla (7 T) superconducting magnet 12. Polarization transfer of $13^C$ in diamond particles is carried out by optically pumping a laser 14 at low field $B_{pol}$(0-1 T) in a shielded volume 16 below the magnet after which the sample is shuttled rapidly back and forth between the shielded volume and the magnet for measure at 7 T. A liquid nitrogen gun enables sample freezing at $B_{pol}$.

Shuttling is enabled by a carbon fiber rod 18 that carries the sample. The rod is mounted on a movable twin carriage on the fast conveyer belt actuator stage 20. The NMR tube 22, shown in an exploded view to the side, which carries the sample is attached to the shuttling rod by a pressure fit arrangement using a pair of O-rings. Diamond powder sample 28 is contained with a dielectric mirror plunger 26 employed to increase the efficiency of optical excitation. An iron shielded volume 16 is placed on sliding rails to counter the magnetic force from the 7 T magnet 12. The bore of the 7 T magnet is sealed with a Teflon guide that ensures the perfectly aligned shuttling and high fill-factor for inductive readout.

The process takes either diamond particles in dry or solution form, and places it into the apparatus. The apparatus has a microwave source 28 that irradiates the sample at low field ($B_{pol}$~0-1 T) after which the sample is shuttled rapidly for bulk inductive readout at 7 T. The polarization enhancement is quantified with respect to the thermal signal at 7 T.

Figure 2:
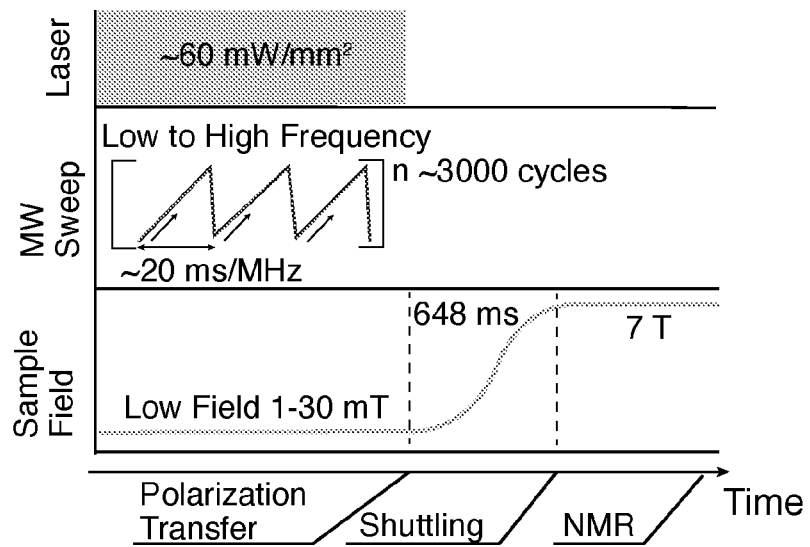
FIG. 2 shows graphs of the laser, microwave frequency sweeps and polarization transfer as well as inductive measurement for a DNP hyperpolarization experiment.
Figure 3:
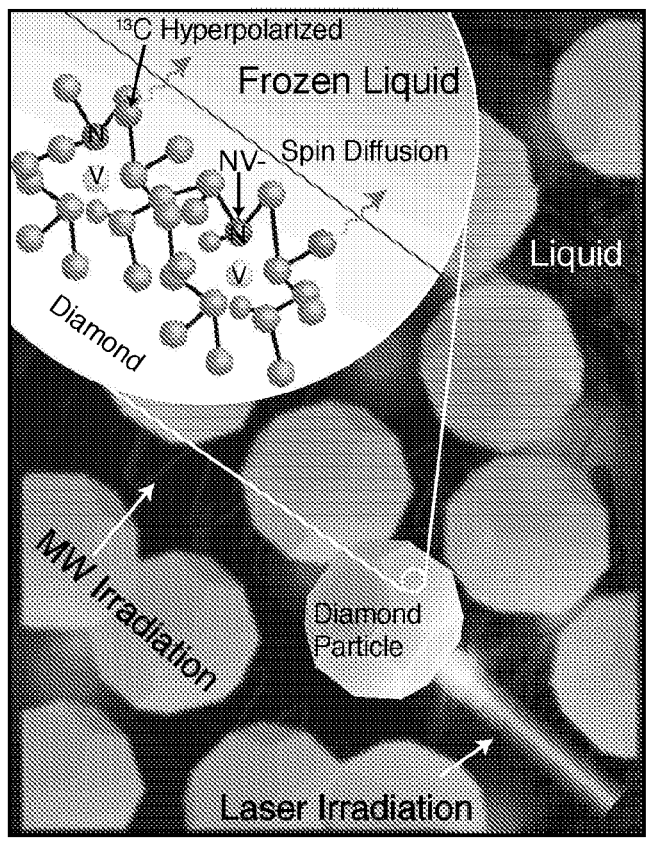
FIG. 3 shows a schematic representation of a DNP experiment and subsequent spin diffusion from the diamond nanoparticles to spins in an external liquid.

FIG. 2 shows an embodiment of the polarization transfer protocol. Laser light at 532 nm at approximately 60 mW/mm$^2$ is continuously applied as shown in the Laser graph at the top of FIG. 2. Microwave irradiation sweeps across the NV center spectrum in approximately 20 ms/MHz for 3000 cycles as shown in the MW Sweep graph of FIG. 2 at $B_{pol}$ to hyperpolarize the $^{13}$C nuclei. As shown in the lower Polarization Transfer graph at the bottom, the shuttling window takes approximately 648 ms as shown in the Sample Field graph. FIG. 3 shows a representative graphic of optically hyperpolarized $^{13}$C diamond nuclei relay polarization to $^{13}$C spins in a frozen liquid by spin diffusion aided by the intrinsically large surface area of particles. Subsequent rapid thaw allows for NMR detection with chemical shift resolution.

Nuclear hyperpolarization is affected by sweeping microwave irradiation across the NV center powder pattern at a low field $B_{pol}$≈0-1 T under continuous laser irradiation. Overall, the embodiments present a significant advance towards an optical diamond polarizer shown in FIG. 1 where polarization is transferred from the $^{13}$C in the high surface area particles to external $^{13}$C spins via spin-diffusion under mild sample freeze. Considering a spin diffusion constant of D=8×10$^3$ Å$^2$/s, one can potentially polarize ~244 µL of liquid per milligram of 100 nm hyperpolarized diamonds in 125 seconds. Moreover, the use of $^{13}$C enrichment in the diamond particles or as surface coatings will greatly enhance these spin diffusion rates to external liquids.

Figure 4:
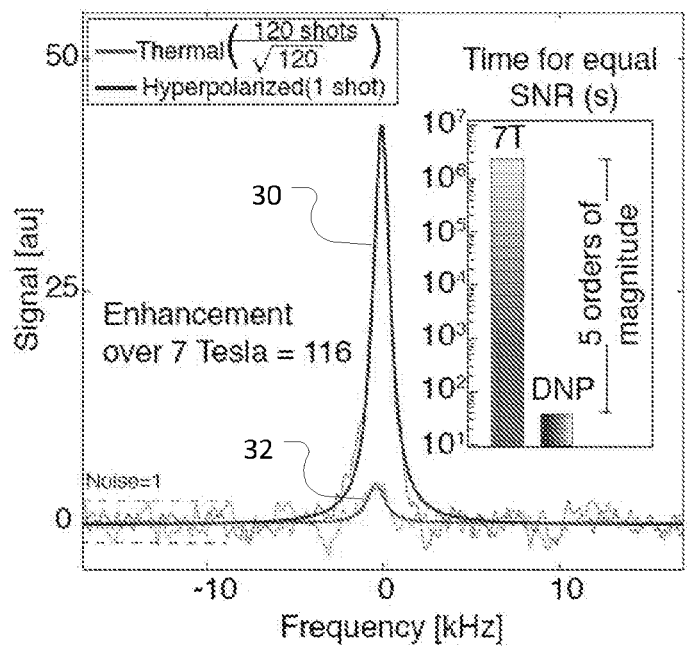
FIG. 4 shows a graph of a typical signal gain by DNP in comparison with thermal signal at 7 T.

FIG. 4 shows a typical signal gain in DNP. The line 30 shows the $^{13}$C NMR signal due to Boltzman polarization at 7 T, averages 120 times over 7 hours. The line 32 is a single shot DNP signal obtained with 40 s of optical pumping, enhanced by 116 over the 7 T thermal signal, or enhanced 101,500 times at the $B_{pol}$=8 mT.

Figure 5:
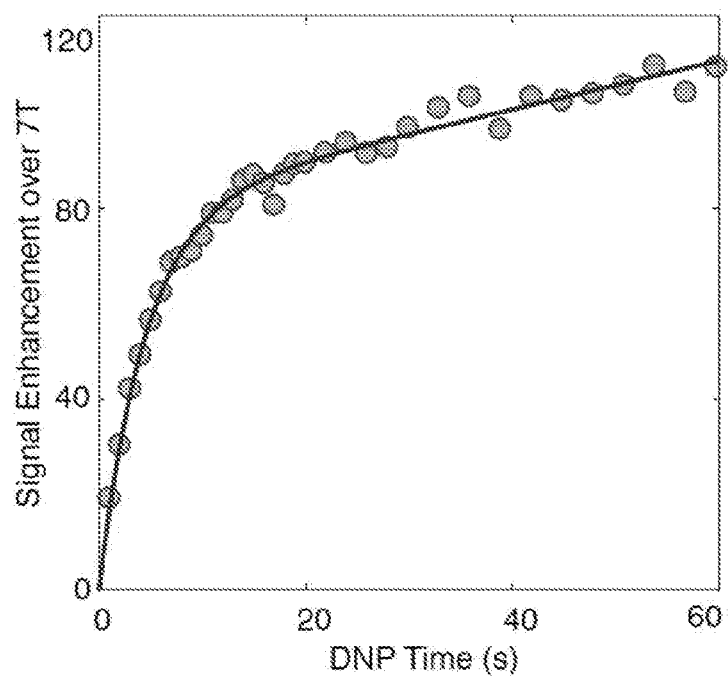
FIG. 5 shows a buildup curve showing rapid growth of diamond polarization.

FIG. 4 summarizes the key features of the technique, demonstrated for a typical example of 200 µm microparticles containing about 1 ppm of NV centers. The process obtains $^{13}$C hyperpolarization over 116 times that of the 7 T Boltzmann level, shown in FIG. 4, a remarkably high polarization level comparable to the best results on single crystals, yet achieved here on a randomly oriented powder. Note that this enhancement is approximately 31000-fold larger than previous work hyperpolarizing nanodiamonds via conventional DNP. The polarization builds up surprisingly rapidly as shown in FIG. 5, in under 40 s of optical pumping, and points to the efficiency of the underlying DNP mechanism. For clarity, the signals in FIG. 4 have their noise unit-normalized, and a single shot DNP signal has about 10 times the signal-to-noise (SNR) of the 7 T thermal signal obtained after ~7 hr of averaging—a time gain of over 5 orders of magnitude for identical SNR. In fact, the $^{13}$C signal is so greatly enhanced that it enables detection of a single 200 µm particle in a single shot with unit SNR.

Figure 6:
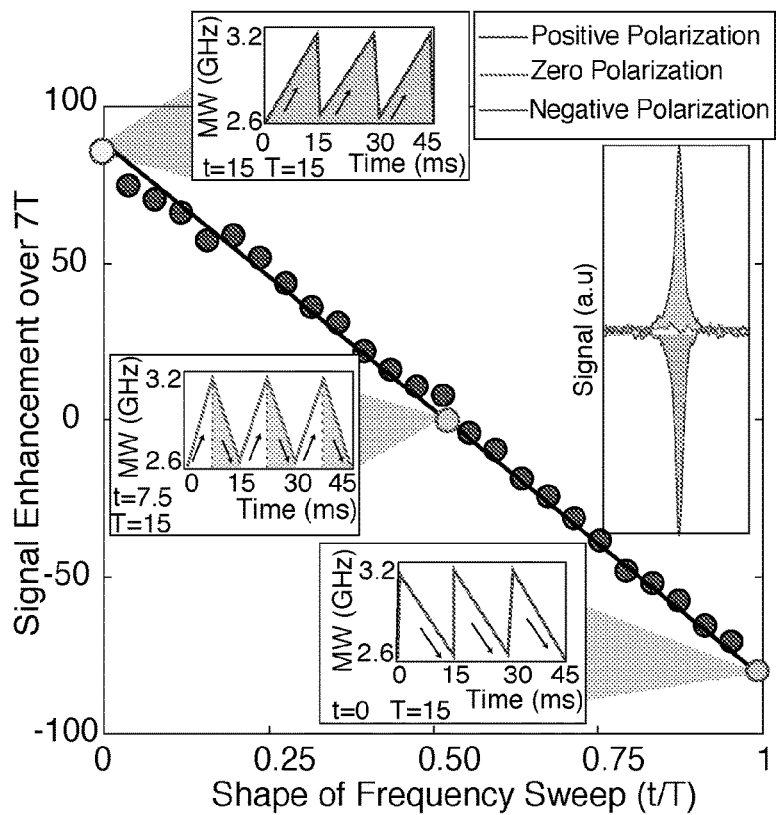
FIG. 6 shows a graph of a shape of a frequency sweep versus direction of signal polarization.

Even more remarkably, the technique here allows exquisite control of the hyperpolarization direction as shown in FIG. 6. Sweeping the microwaves in a ramp fashion from low-to-high frequency leads to nuclear polarization aligned to $B_{pol}$, and from high-to-low frequency leads to nuclear polarization anti-aligned to $B_{pol}$. This is, to the inventors' knowledge, the first solid-state DNP mechanism that allows such on-demand control of the sign of polarization. As expected, a triangular sweep pattern leads to destructive interference in alternate periods, and no net polarization buildup as shown in FIG. 6. The embodiments envision utility of this unique feature for common-mode noise rejection in signal enhanced diamond particle imaging. Such room temperature hyperpolarized MRI would provide a complimentary, non-invasive, 3D imaging modality to high NV density diamond particles that have so far been carved out a niche as non-blinking, fluorescent biomarkers [4-7]. The fact that through the methods here, functionalized diamond microparticles in solution can be hyperpolarized with modest optical power ~8 mW/200 µt particle to single shot detection sensitivity, will open up new possibilities for targeted biosensing NV orientation. [8-10].

Figure 7:
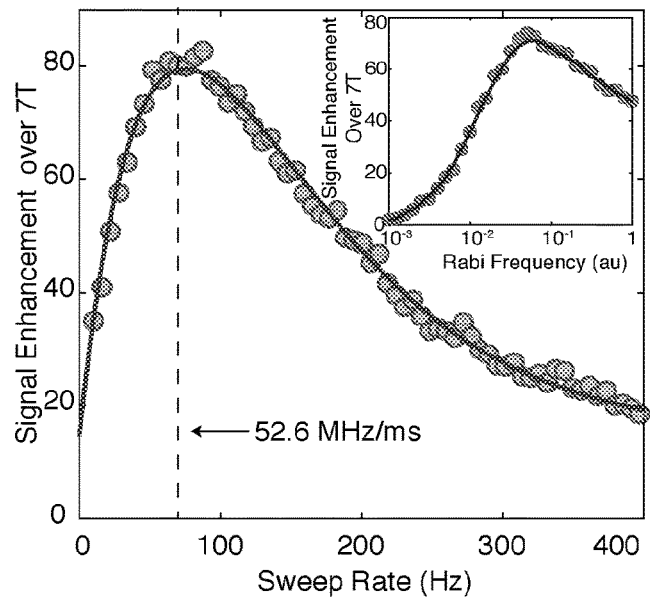
FIG. 7 shows a graph of microwave sweep rate versus signal enhancement.

The sign control of hyperpolarization is a consequence of the DNP mechanism being a coherent process, driven by a series of successive rapid adiabatic population swaps. This is substantiated in FIG. 7, where the process studies the dependence on the MW sweep rate $f_{MW}$. The remarkably simple dependence $\varepsilon \alpha f_{MW} \exp(-\alpha f_{MW})$, the solid line in FIG. 7, points to an optimum sweep rate set by adiabaticity constraints. One should note that FIG. 7 is astonishingly regular despite the sample consisting of completely randomly oriented particles and sampling every possible NV orientation.

Figure 8:
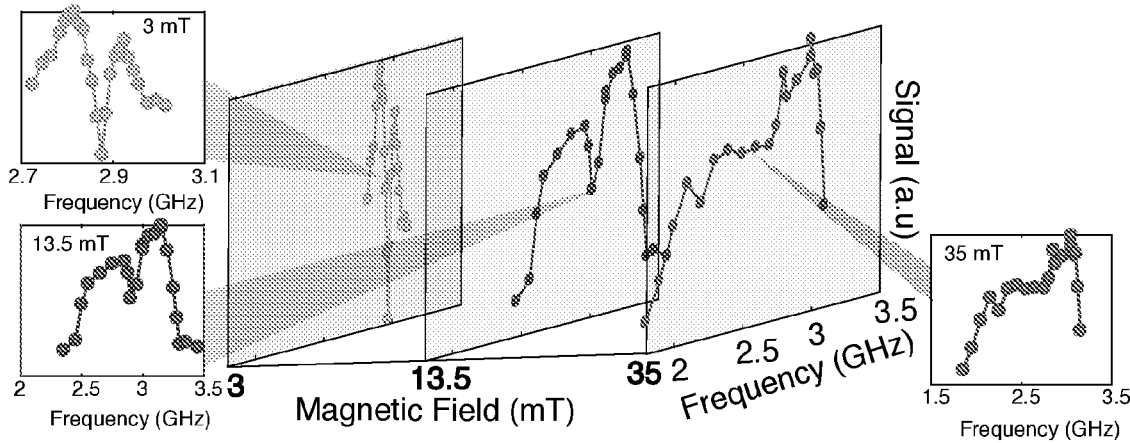
FIG. 8 shows embodiments of widening electronic powder pattern matching graphs.
Figure 9:
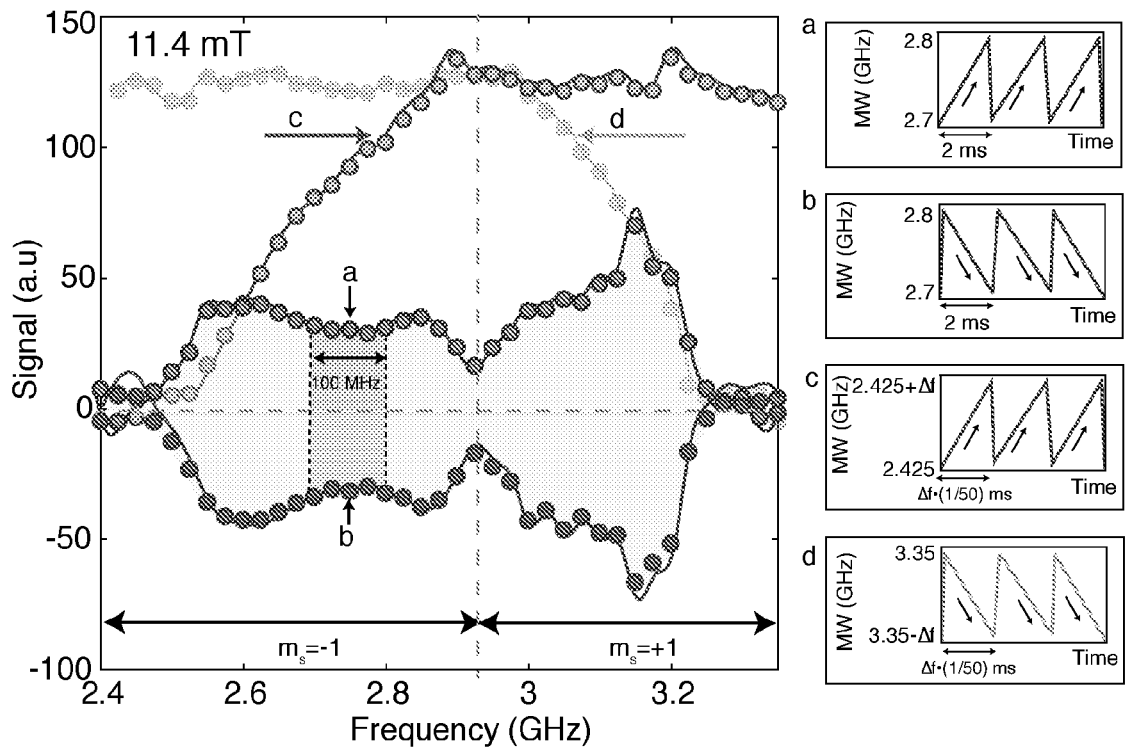
FIG. 9 shows a graph of sign contributions from different nitrogen vacancy (NV) orientations and signal enhancement from low to high versus high to low frequency microwave sweeps.

To demonstrate more precisely that all NV center orientations contribute to the obtained hyperpolarization signal, the process maps the underlying electronic powder pattern via the $^{13}$C signal as shown in FIGS. 8 and 9. The DNP is performed by sweeping microwaves over a 100 MHz window which is subsequently moved in frequency space. While natively a convolution, the obtained signal does faithfully report on the electronic line shape broadening as expected with increasing field as shown in FIG. 8. The results in FIG. 9 also exhibit another surprising aspect of the mechanism disclosed here. Unlike in conventional DNP methods such as solid, cross effects and thermal mixing, where one expects a dispersion-like frequency dependence where certain parts of the electronic spectrum contribute positively or negatively to the enhancement, here all parts of the spectrum provide the same enhancement sign. This is also independent of whether one accesses the part of the spectrum corresponding to ms=+1 or ms=−1 electronic spin states. The hyperpolarization sign, as in FIG. 6, only depends on the direction of MW sweep.

FIG. 9 also illustrates that only half the full electronic spectrum is sufficient to saturate the full extent of polarization, consistent with the fact that every NV center orientation is represented on either half of the powder pattern. These results demonstrate that in addition to providing impressive signal enhancements, the embodiments exploit a unique low-field DNP mechanism that is qualitatively different from others in the literature. The process exploits the fact that the NV electrons are be optically polarized at any field, and low fields mitigate their strong orientational dependence. Technologically too the embodiments here are extremely simple to construct: hyperpolarization occurs at room temperature, MW amplifiers and sweep sources in the 2-4 GHz range are low-cost and readily available, a simple stub antenna serves for MW irradiation, the laser and MW powers employed are very modest, and no requirements on magnetic field alignment.

Low field also comes with the added benefit of long target nuclear T1's in the external liquid due to reduced chemical shift anisotropy, allowing the potential for higher buildup of polarization. For instance, $^{13}C$ spins in pyruvate, an important molecule in the metabolic cycle and cancer detection, can exceed 55 s at 10 mT. When mildly frozen, for instance at liquid nitrogen temperature, the resulting T1 can be nearly an hour. The only cost one pays, however, is the lower nuclear T1 times in diamond at low fields, which limits the time period for spin diffusion within each particle. There is a strong indication that the $^{13}C$ lifetime is set by their interactions to the dominant dipole coupled electronic spin bath consisting of nitrogen impurities (P1 centers). Recent advances in diamond growth with high (>20%) NV center conversion efficiency give optimism that they can be effectively mitigated. Moreover, there is strong evidence that $^{13}C$ lifetimes can be maintained rather long even for particles sizes down to 100 nm.

Figure 10:
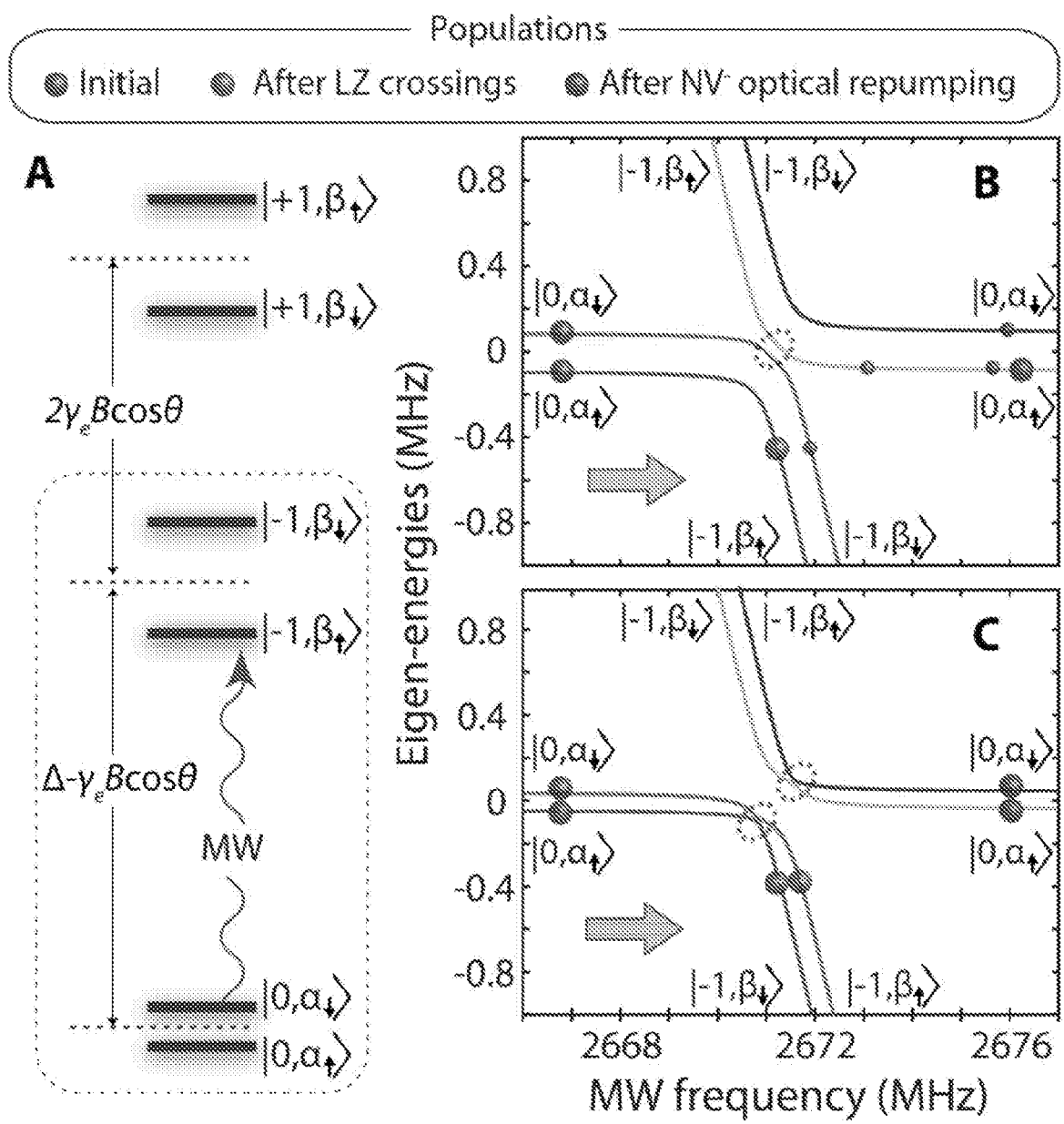
FIG. 10 shows energy level diagrams and dynamics of nuclear spin hyperpolarization based on embodiments of proposed mechanism of polarization transfer.

FIG. 10 illustrates the proposed mechanism of polarization transfer. The process of nuclear spin hyperpolarization can be better understood in the rotating frame, where resonances take the form of avoided crossings. Because one traverses the full set of mS=0 H mS=+1 transitions, moderately fast sweep rates make the more weakly avoided crossings partially non-adiabatic, thus resulting in a selective population transfer between the different branches and, consequently, the generation of net nuclear spin polarization. As an illustration, consider the case of a positive hyperfine coupling ($A_{zz}$=+0.5 MHz) shown in FIG. 8 in the subset mS=0 H mS=−1. Assuming that for simplicity, the NV spin is in the mS=0 state, nuclear spins polarize positively, as one sweeps the Landau-Zener crossing from low to high frequencies; similarly, a negative polarization arises if one starts from the right side of the crossing and the direction of the sweep is reversed. Central to this proposed polarization process are the differential Landau-Zener transition probabilities, selectively favoring, in this case, the transfer of populations between branches with different electron and nuclear spin quantum numbers. The resulting nuclear spin polarization is negligible if the population transfer throughout the Landau-Zener crossings is complete (the fully nonadiabatic limit), meaning that the optimum is attained at some intermediate sweep rate, consistent with observations.

The dynamics for negative hyperfine couplings are qualitatively different. The more weakly avoided crossings occur between branches within the same electron spin manifold, with the consequence that the nuclear spin polarization buildup becomes inefficient in either sweep direction FIG. 9. In other words, because one sweeps the set of transitions connecting the mS=0 and mS=−1 manifolds, only carbon spins with positive hyperfine couplings contribute to pump nuclear spin polarization. The converse is true for the mS=0 ↔mS=+1 subset of transitions because, when |$A_{zz}$| is greater than the nuclear Larmor frequency, the physics remains unchanged if one simultaneously reverses the signs of the electron spin projection number and hyperfine coupling constant. Because the number of nuclear spins experiencing positive and negative hyper-fine couplings is comparable, it follows the notion that the 13C signals from the mS=0 H mS=+1 manifold should feature similar amplitudes and the same (sweep direction-dependent) sign, as observed within them S=0↔mS=−1 subsets as shown in FIG. 9.

In conclusion, the embodiments here have developed a new DNP technique for polarization transfer from NV centers in diamond that is completely orientation independent, and demonstrated its application for hyperpolarizing $^{13}C$ nuclei in diamond microparticles to >0:12% bulk polarization level. The method was also found to work on smaller particles (1 μm), although DNP enhancements were reduced because lower NV concentrations and shorter T1. The embodiments of low-field optical DNP mechanism is fundamentally unique, the entire electronic spectrum contributing constructively to the polarization buildup, and allowing on-demand control on the hyperpolarization direction. This work paves the way towards exploiting the large surface area and optical polarizabilty intrinsic to diamond particles for optically hyperpolarizing a liquid at room temperature. Moreover, it presents an advance towards magnetic resonance imaging modalities for biosensing constructed out of optically hyperpolarized, surface functionalized, diamond particles.

REFERENCES

[1] D. Abrams, M. E. Trusheim, D. R. Englund, M. D. Shattuck, and C. A. Meriles, Nano letters 14, 2471 (2014).
[2] M. Chen, M. Hirose, P. Cappellaro, et al., Physical Review B 92, 020101 (2015).
[3] A. J. Parker, K. Jeong, C. E. Avalos, B. J. Hausmann, C. C. Vassiliou, A. Pines, and J. P. King, arXiv preprint rXiv:1708.00561 (2017).
[4] S.-J. Yu, M.-W. Kang, H.-C. Chang, K.-M. Chen, and Y.-C. Yu, Journal of the American Chemical Society 127, 17604 (2005).
[5] Y.-R. Chang, H.-Y. Lee, K. Chen, C.-C. Chang, D.-S. Tsai, C.-C. Fu, T.-S. Lim, Y.-K. Tzeng, C.-Y. Fang, C.-C. Han, et al., Nature nanotechnology 3, 284 (2008).
[6] A. Bumb, S. K. Sarkar, N. Billington, M. W. Brechbiel, and K. C. Neuman, Journal of the American Chemical Society 135, 7815 (2013).
[7] M. Montalti, A. Cantelli, and G. Battistelli, Chemical Society Reviews 44, 4853 (2015).
[8] K.-K. Liu, C.-L. Cheng, C.-C. Chang, and J.-I. Chao, Nanotechnology 18, 325102 (2007).
[9] C.-C. Fu, H.-Y. Lee, K. Chen, T.-S. Lim, H.-Y. Wu, P.-K. Lin, P.-K. Wei, P.-H. Tsao, H.-C. Chang, and W. Fann, Proceedings of the National Academy of Sciences 104, 727 (2007).
[10] Y. Wu, F. Jelezko, M. B. Plenio, and T. Weil, Angewandte Chemie International Edition 55, 6586 (2016).

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of hyperpolarizing diamond particles, comprising:
applying a laser to a sample of the diamond particles in a low magnetic field;
irradiating the diamond particles with a microwave signal sweeping across a frequency range to cause diamond polarization in the low magnetic field, the microwave signal direction being switchable between two directions, the direction determining a sign of the polarization;

shuttling, with a movable carrier, the diamond particles back and forth between the low magnetic field and a high magnetic field to detect $^{13}$C nuclei in the diamond particles, the high magnetic field being higher than the low magnetic field; and transferring the diamond polarization to nuclear spins to one of a surrounding solid or fluid.

2. The method as claimed in claim 1, further comprising freezing the sample.

3. The method as claimed in claim 1, wherein applying the laser comprises optically pumping the laser prior to application.

4. The method as claimed in claim 3, wherein optically pumping the laser comprises optically pumping the laser for a time period of 1 second to tens of minutes.

5. The method as claimed in claim 1, wherein applying the laser comprises applying the laser in a shielded volume below the magnetic field prior to shuttling.

6. The method as claimed in claim 1, wherein applying the laser to the sample comprises applying the laser to a dry sample.

7. The method as claimed in claim 1, wherein applying the laser to the sample comprises applying the laser to a sample in solution.

8. The method as claimed in claim 1, wherein irradiating the diamond particles comprises irradiating the diamond particles with laser and microwave held at different magnetic field ranges from 0-1 Tesla.

9. The method as claimed in claim 1, wherein irradiating the diamond nanoparticles comprises sweeping the microwaves in a ramp.

10. The method as claimed in claim 9, wherein the ramp comprises a low-to-high ramp.

11. The method as claimed in claim 9, wherein the ramp comprises a high-to-low ramp.

12. The method as claimed in claim 9, wherein multiple ramps are cascaded to produce a microwave frequency comb.

* * * * *